(12) United States Patent
Sim

(10) Patent No.: US 6,374,380 B1
(45) Date of Patent: Apr. 16, 2002

(54) BOUNDARY SCAN CELLS TO IMPROVE TESTABILITY OF CORE-EMBEDDED CIRCUITS

(75) Inventor: Gyoo-Chan Sim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/393,001

(22) Filed: Sep. 9, 1999

(30) Foreign Application Priority Data

Sep. 17, 1998 (KR) .............................................. 98-38531

(51) Int. Cl.[7] .............................................. G01R 31/28
(52) U.S. Cl. ........................................ 714/727; 714/742
(58) Field of Search ................................ 714/726, 727, 714/729, 724, 725, 730, 731–745; 395/500; 438/6

(56) References Cited

U.S. PATENT DOCUMENTS

| 5,068,603 A | * 11/1991 | Mahoney .................... 714/726 |
| 5,452,239 A | * 9/1995 | Dai et al. .................. 395/500.4 |
| 5,843,799 A | * 12/1998 | Hsu et al. ...................... 438/6 |
| 5,960,191 A | * 9/1999 | Sample et al. ......... 395/500.49 |

* cited by examiner

*Primary Examiner*—Albert Decady
*Assistant Examiner*—Emeka J. Amanze
(74) *Attorney, Agent, or Firm*—Marger Johnson & McCollom, P.C.

(57) ABSTRACT

As system-on-a-chip (SOC) designs become popular these days, the number of embedded cores in a chip gets larger, raising test issues of glue logic test as well as embedded core test. A core-embedded integrated circuit comprising a first logic block, a second logic block, a signal line coupled between the first logic block and the second logic block for inputting/outputting an input/output signal of the logic blocks, and a boundary scan cell coupled to the signal line for loading /capturing the input/output signal for testing one or both of the first logic block and the second logic block (individually or together), with minimum overhead. Each boundary scan cell includes a data holding capability for data loading from the first and/or second logic block, wherein each boundary scan cell is adapted for serial connection with another of a plurality of like boundary scan cells (boundary scan cell chaining). The boundary scan cells according to the present invention increase testability of the glue logic and the cores with minimal overhead and simple test control, in contrast with a prior art Joint Test Action Group (JTAG) boundary scan design method.

21 Claims, 8 Drawing Sheets

BOUNDARY SCAN CELLS TO IMPROVE TESTABILITY OF CORE-EMBEDDED CIRCUITS

FIELD OF THE INVENTION

The present invention relates to a boundary scan cell for testing integrated circuits, and more particularly to boundary scan cells improve testability of core-embedded integrated circuits.

BACKGROUND OF THE INVENTION

There are increasing number of core-based integrated circuit (IC) designs lately. It means that a system-on-a-chip (SOC) design style is generally recognized as a new design trend. Thus, a memory core or an analog core, as well as a central processing unit (CPU) core, is frequently used in the IC design. In addition, there is a tendency to invest the IC with plural and various kinds of cores.

In a core-based IC, a testability of a user defined logic (UDL) around the core is dependent upon the accessibility of interface signals between the core and the UDL. The UDL is called a glue logic hereinafter. A direct access (DA) testing method, extracting these interface signals to external pins, is simple and effective. The DA testing method is set forth in a paper titled "Direct Access Test Scheme-Design of Block and Core Cells for Embedded ASIC", by V. Immaneni and S. Raman, Proc. of International Test Conference, pp. 488–492, 1990. In that case, if the number of interface signals is high, it is hard to test the core-embedded circuit due to excessive pin overhead.

One proposed solution to the foregoing problem involves constructing an isolation ring around the core, which is generally used for testing the core and the glue logic. The method is described in a paper titled "Modifying User-Defined Logic For Test Access To Embedded Cores," by B. Pouya and N. A. Touba of International Test Conference, pp. 60–68, 1977. According to that testing method, each block embedded in the IC can be tested separately by constructing a boundary scan chain between the core and the glue logic, so that all the interface signals to the cores become fully accessible and the testability of the core and the glue logic can be improved without an excessive pin overhead. For this purpose, well-known Joint Test Action Group (JTAG) boundary scan design method, IEEE standard 1149.1 may be adopted.

However, the JTAG method requires not only additional logic overhead of a test access port (TAP) controller but also compliance to the complex test protocols of the standard. For more detailed description of the boundary scan test technique embedded in the IEEE standard 1149.1, reference should be made to the publication IEEE standard TAP and boundary scan architecture, published by the Institute of Electrical and Electronics Engineers, New York (1990), herein incorporated by reference.

Other examples of boundary cells are disclosed in U.S. Pat. No. 5,220,281 to Matsuki, issued on Jun. 15, 1993, "BOUNDARY SCAN CELL FOR Bidirectional INPUT/OUTPUT TERMINALS"; U.S. Pat. No. 5,260,948 to Simpson et al., issued on Nov. 9, 1993, "BIDIRECTIONAL BOUNDARY SCAN CIRCUIT"; and U.S. Pat. No. 5,701,307 to Lee D. Whetsel, issued on Dec. 23, 1997, "LOW OVERHEAD INPUT AND OUTPUT BOUNDARY SCAN CELLS", all of which disclosures are incorporated herein by reference. However, an unavoidably excessive constructional pin overhead is generated in the above boundary scan cells adopting the IEEE standard 1149.1.

For this reason, it may be difficult to test the core and the glue logic with a lower pin overhead and an improved testability. Therefore, a new boundary scan cells design is needed to increase the testability of the core and the glue logic, respectively or together, with minimal area overhead and simple test control, compared to the JTAG method.

SUMMARY OF THE INVENTION

It is therefore an object of the present invention to provide boundary scan cells increasing the testability of the core and the glue logic, respectively or together, with minimal area overhead and simple test control.

In order to attain the above objects, according to an aspect of the present invention, there is provided a core-embedded integrated circuit comprising a first logic block, a second logic block, a signal line coupled between the first logic block and the second logic block for inputting/outputting an input/output signal of the logic blocks, and a boundary scan cell coupled to the signal line for loading/capturing the input/output signal for testing the first logic block and the second logic block, respectively or together, with minimum overhead. The boundary scan cell is adapted for serial connection with other similar boundary scan cells in a single chain and each scan cell has a data holding capability for data loading.

In the core-embedded circuit according to the invention, the boundary scan cell comprises: a scan flip-flop having a plurality of input ports receiving plural corresponding data input signals, a scan input signal, a scan enable signal and a scan clock signal, and an output port, so as to perform a scan operation for generating a scan output signal, and a normal operation for capturing the bidirectional signal or loading the scan output signal into one of the logic blocks through the bidirectional signal line; a first multiplexer for generating the data input signal of the scan flip-flop by selecting either the bidirectional signal from the bidirectional signal line or the scan output signal from the scan flip-flop, to perform the normal operation, in response to an input/output control signal determining an input/output direction of the scan cell; a logic circuit for generating a load control signal in response to the scan enable signal enabling the scan operation, the first mode control signal enabling the test operation, and the input/output control signal determining the direction of the scan cell; and a tri-state buffer for loading the scan output signal to one of the logic blocks through the bidirectional signal line in response to the load control signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
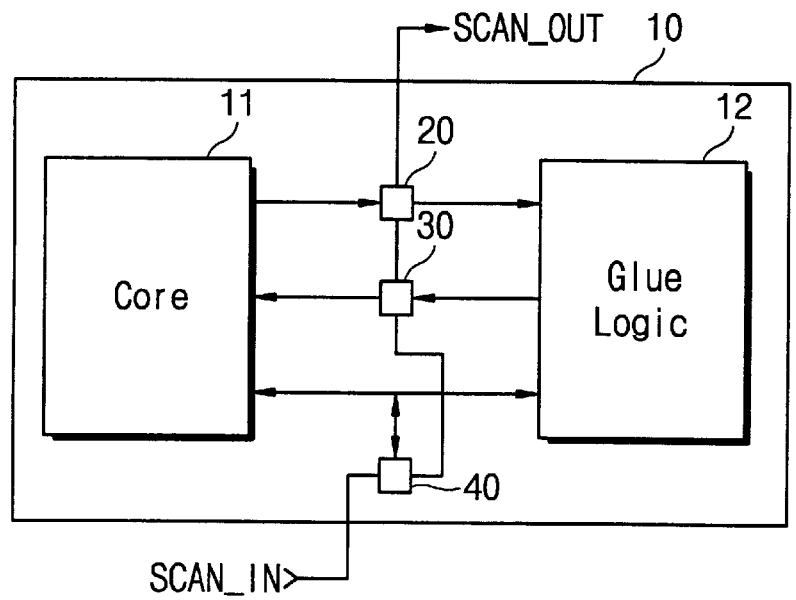
FIG. 1 is a schematic block diagram illustrating a structure of a core-embedded circuit according to the present invention.

FIG. 1 is a schematic block diagram illustrating a preferred embodiment of a core-embedded circuit 10 according to the present invention. Referring to FIG. 1, a plurality of boundary scan cells 20, 30 and 40 are constructed between the core 11 and the glue logic 12 so as to improve testability the glue logic 12.

From the FIG. 1, it is clear that the interfaced signals between the core 11 and the glue logic 12 affect the testability of each block. Therefore, to improve the testability of the glue logic 12 by forming a boundary scan chain around the core 11, individual testability requirements of the interfaced signals need to be examined first. Those requirements can be categorized into three cases as follows.

1) To load an input signal of the glue logic.
2) To capture an output signal of the glue logic.
3) To load and capture a bidirectional signal of the glue logic.

Figure 2:
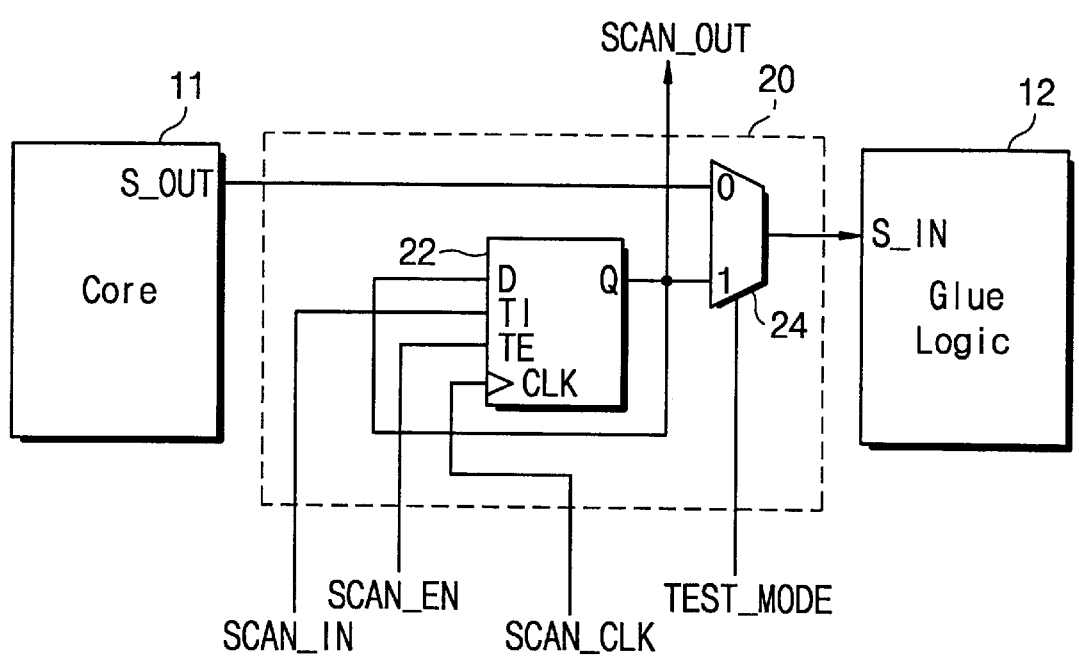
FIG. 2 is a schematic circuit diagram illustrating a boundary scan cell for an input signal of a glue logic.
Figure 4:
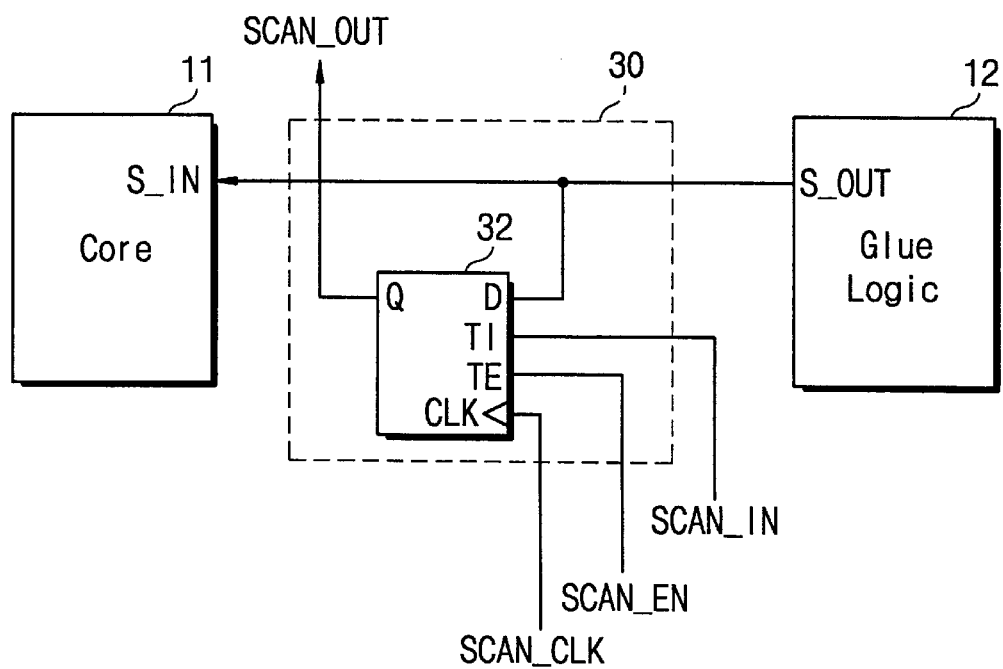
FIG. 4 is a schematic circuit diagram illustrating a boundary scan cell for an output signal of the glue logic.
Figure 5:
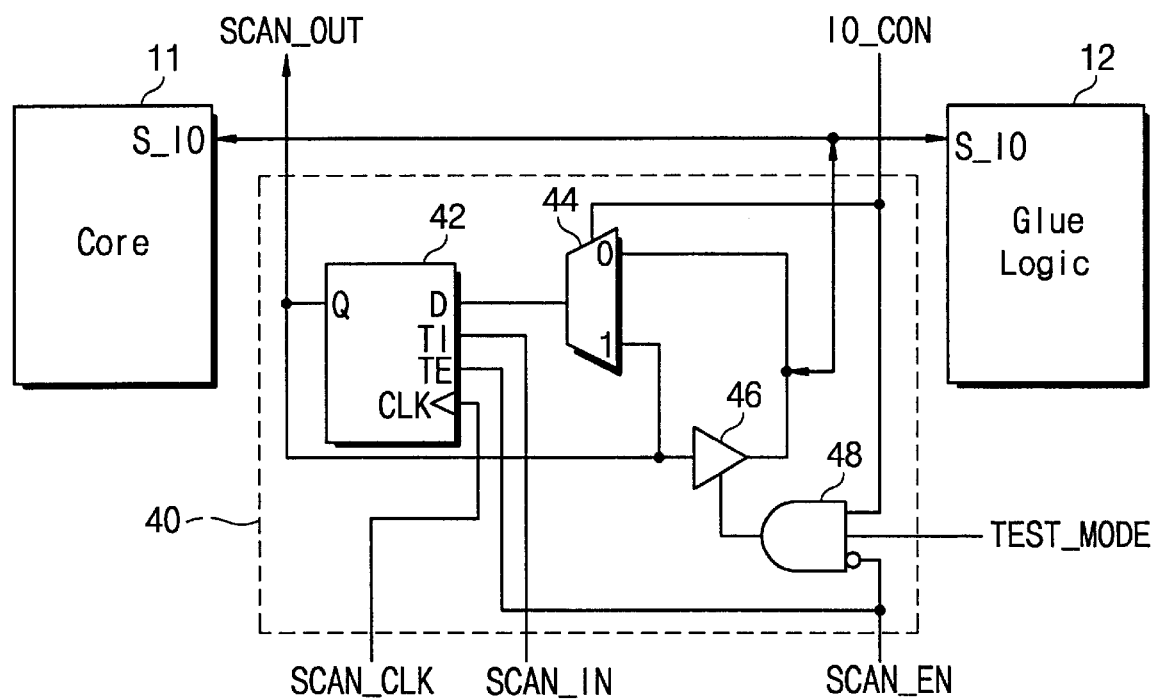
FIG. 5 is a schematic circuit diagram illustrating a boundary scan cell for a bidirectional signal of the glue logic.

FIGS. 2, 4 and 5 show the boundary scan cells 20, 30 and 40 for each case classified above. FIG. 2 is a schematic circuit diagram illustrating a boundary scan cell 20 for an input signal of a glue logic 12. Referring to FIG. 2, the scan cell 20 includes a scan flip-flop 22 and a multiplexer 24.

The scan flip-flop 22 has a data input port D coupled to its output port Q, a scan input port TI for receiving a scan input signal SCAN_IN, a scan enable port TE for receiving a scan enable signal SCAN_EN, and a clock input port CLK for receiving a scan clock signal SCAN_CLK.

An output port S_OUT of the core 11 is coupled to a first input port of the multiplexer 24, and the output port Q of the scan flip-flop 22 is coupled to a second input port of the multiplexer 24. The multiplexer 24 outputs either the output signal from the core 11, or the scan output signal SCAN_OUT from the scan flip-flop 22 to the glue logic 12 as a test data, in response to a mode control signal TEST_MODE. Test items of the scan cell 20 corresponding to the mode control signal TEST_MODE are described in Table 1.

TABLE 1

| TEST_MODE | Test Item |
| --- | --- |
| 0 | Functional Operation |
| 1 | Glue Logic Test |

As shown in Table 1, the scan cell 20 executes a functional operation (i.e., non-test operation) and a glue logic test operation in response to the mode control signal TEST_MODE.

When the mode control signal TEST_MODE is logic low ("0"), the output signal from the core 11 is input to the glue logic 12 through the multiplexer 24 without passing through the scan flip-flop 22.

On the other hand, when the mode control signal TEST_MODE is logic high ("1") and the scan enable signal SCAN_EN is logic high ("1"), the scan flip-flop 22 performs a scan operation (i.e., time-shifting operation). In the scan operation, the scan flip-flop 22 generates the scan output signal SCAN_OUT to the scan chain (not shown) through the out port Q in synchronism with the scan clock signal SCAN_CLK. The generated scan output signal SCAN_OUT is fed back to the data input port D, so as to hold the scan output signal SCAN_OUT during a normal operation of the scan flip-flop 22. Subsequently, when the scan enable signal SCAN_EN is converted to logic low ("0") while the mode control signal TEST_MODE is contained logic high ("1"), the scan flip-flip performs the normal operation to load the held scan output signal SCAN_OUT into the glue logic 12 as an input signal of the glue logic 12. As described above, for the first case of data loading, the scan flip-flop 22 shown in FIG. 2 time-shifts in a datum needed for glue logic 12 during the test mode.

Note that there is a feedback path from the output port Q to the data input port D of the scan flip-flop 22. This ensures the shifted data to be maintained while the glue logic 12 undergoes normal operational cycles when the scan enable signal SCAN_EN goes low. Such a data hold capability of the boundary scan cell 20 for data loading is crucial for the testability of the glue logic 12. If an input of the data input port D is fixed to a certain value, or floated, without the feedback loop, the data needed for the glue logic 12 cannot be fully controlled through the scan operation, in which case the testability of glue logic 12 is degraded.

Figure 3:
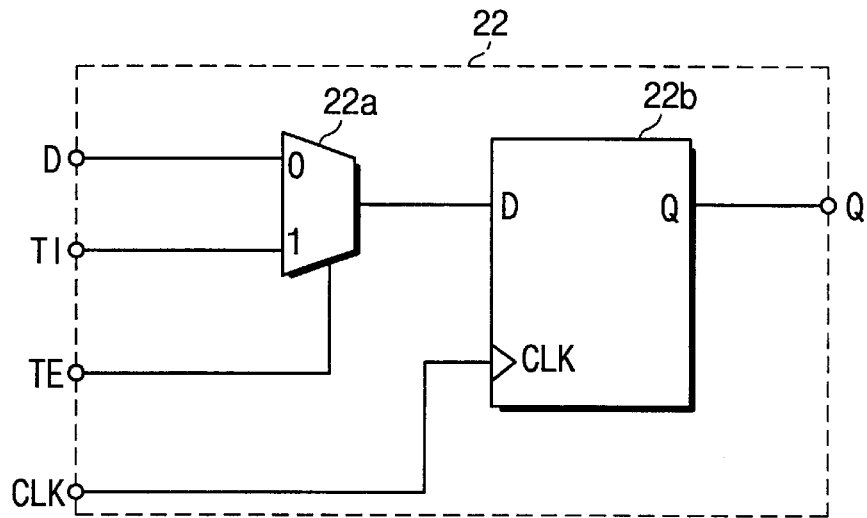
FIG. 3 is a detailed circuit diagram illustrating a scan flip-flop shown in FIG. 2.

FIG. 3 is a detailed circuit diagram illustrating a scan flip-flop 22 shown in FIG. 2. Referring to FIG. 3, the scan flip-flop 22 includes a multiplexer 22a and a D-type flip-flop 22b. A first input port of the multiplexer 22a is coupled to the data input port D, and a second input port of the multiplexer 22a is coupled to the scan input port TI. A selection signal of the multiplexer 22a is supplied from the scan enable port TE. An output port of the multiplexer 22a is coupled to a data input port D of the D-type flip-flop 22b. The scan clock signal SCAN_CLK is provided to the port CLK of the D-type flip-flop 22b.

As described above, when the scan enable signal SCAN_EN is logic high ("1"), the scan cell 20 performs the scan operation for generating the scan output signal SCAN_OUT which is held by the feedback path. When the scan enable signal SCAN_EN is logic low ("0"), the held scan output signal SCAN_OUT is loaded to the glue logic 12 as the input signal.

FIG. 4 is a schematic circuit diagram illustrating a boundary scan cell 30 for an output signal of the glue logic 12. Referring to FIG. 4, an output port S_OUT of the glue logic 12 is coupled to an input port S_IN of the core 11 via a uni-directional signal line. The scan cell 30 includes a scan flip-flop 32. The scan flip-flop 32 has a plurality of input ports D, TI, TE and CLK, for receiving an output signal from the glue logic 12 to capture the signal, for receiving a scan input signal SCAN_IN, a scan enable signal SCAN_EN and a scan clock signal SCAN_CLK, respectively. Further, the scan flip-flop 32 has an output port Q for outputting a scan output signal SCAN_OUT to the scan chain by scan operation.

For the second case of data capturing, only the output signal of the glue logic 12 needs to be connected to the data input port D of the scan flip-flop 32, as shown in FIG. 4. Hence, there is no circuit element required for the test mode control.

When the scan enable signal SCAN_EN is logic low ("0"), the output signal from the glue logic 12 is captured by the scan flip-flop 32. When the scan enable signal SCAN_EN is converted to logic high ("1"), the scan cell 30 performs the scan operation, so that the captured signal is outputted into the scan chain (not shown).

For the third case of data loading and capturing, the boundary scan cell 40 shown in FIG. 5 can be used. FIG. 5 illustrates a boundary scan cell 40 for a bidirectional signal of the glue logic 12. Referring to FIG. 5, the scan cell 40 includes a scan flip-flop 42, a multiplexer 44, a tri-state buffer 46, and a logic circuit 48.

Each of bidirectional input/output ports S_IOs of the core 11 and the glue logic 12 are coupled with each other by a bidirectional input/output signal line. The scan flip-flop 42 has a data input port D for receiving an output signal from the multiplexer 44, a scan input port TI for receiving the scan input signal SCAN_IN, a scan enable port TE for receiving the scan enable signal SCAN_EN, and a clock input port CLK for receiving the scan clock signal SCAN_CLK. Further, the scan flip-flop 42 has an output port Q for outputting a scan output signal SCAN_OUT to the scan chain, the multiplexer 44, or the tri-state buffer 46. There is a feedback loop between the data input port D and the output port Q of the scan cell 40 for the same purpose of data hold capability as in FIG. 4. The multiplexer 44 has a first input port for receiving the output signal from the glue logic 12, and a second input port for receiving the scan output signal SCAN_OUT from the output port Q. The multiplexer 44 outputs either the output signal or the scan output signal SCAN_OUT to the data input port D of the scan flip-flop 42 in response to an input and output (IO) control signal IO_CON. The tri-state buffer 46 receives and outputs the scan output signal SCAN_OUT from the output port Q to the glue logic 12 via the bidirectional signal line in response to a control signal from the logic circuit 48. The logic circuit 48 is composed of an AND gate receiving the IO control signal IO_CON, a mode control signal TEST_MODE, and a low-active scan enable signal SCAN_EN.

As shown in Table 1, when the mode control signal TEST_MODE is "0", the scan cell 40 performs the functional operation. Since the mode control signal TEST_MODE is "0", the control signal of the logic circuit 48 is logic low during the functional operation. Thus, the tri-state buffer 46 has high impedance, so that the core 11 and the glue logic 12 can communicate without passing through the scan cell 40.

When the mode control signal TEST_MODE is "1", the scan cell 40 performs a glue logic test. During the test mode, if the IO control signal IO_CON is "0", the scan cell 40 is set a data input mode and the input/output port S_IO of the glue logic 12 is set a data output mode. And if the IO control signal IO_CON is "1", the scan cell 40 is set a data output mode and the input/output port S_IO of the glue logic 12 is set a data input mode.

For capturing an output signal of the glue logic 12, the IO control signal IO_CON is set to "0". When the scan enable signal SCAN_EN is "0", the output signal from the glue logic 12 is captured by the scan flip-flop 42. When the scan enable signal SCAN_EN becomes "1", the captured output signal is outputted to the scan chain (not shown) by scan operation of the scan flip-flop 42. In that case, the tri-state buffer 46 maintains the high impedance state during the scan operation, so as to prevent bus conflict.

For loading an input signal to the glue logic 12, the IO control signal IO_CON is set to "1". When the scan enable signal SCAN_EN is "1", the scan flip-flop 42 performs the scan operation for generating the scan output signal SCAN_OUT. The scan output signal SCAN_OUT is outputted to the scan chain (not shown), and fed back to the data input port D of the scan flip-flop 42 through the feedback loop so as to hold the scan output signal SCAN_OUT during the normal operation. When the scan enable signal SCAN_EN becomes "0", the scan cell 40 performs the normal operation. In the normal operation, the held scan output signal SCAN_OUT is loaded to the glue logic 12 through the tri-state buffer 46.

Figure 6:
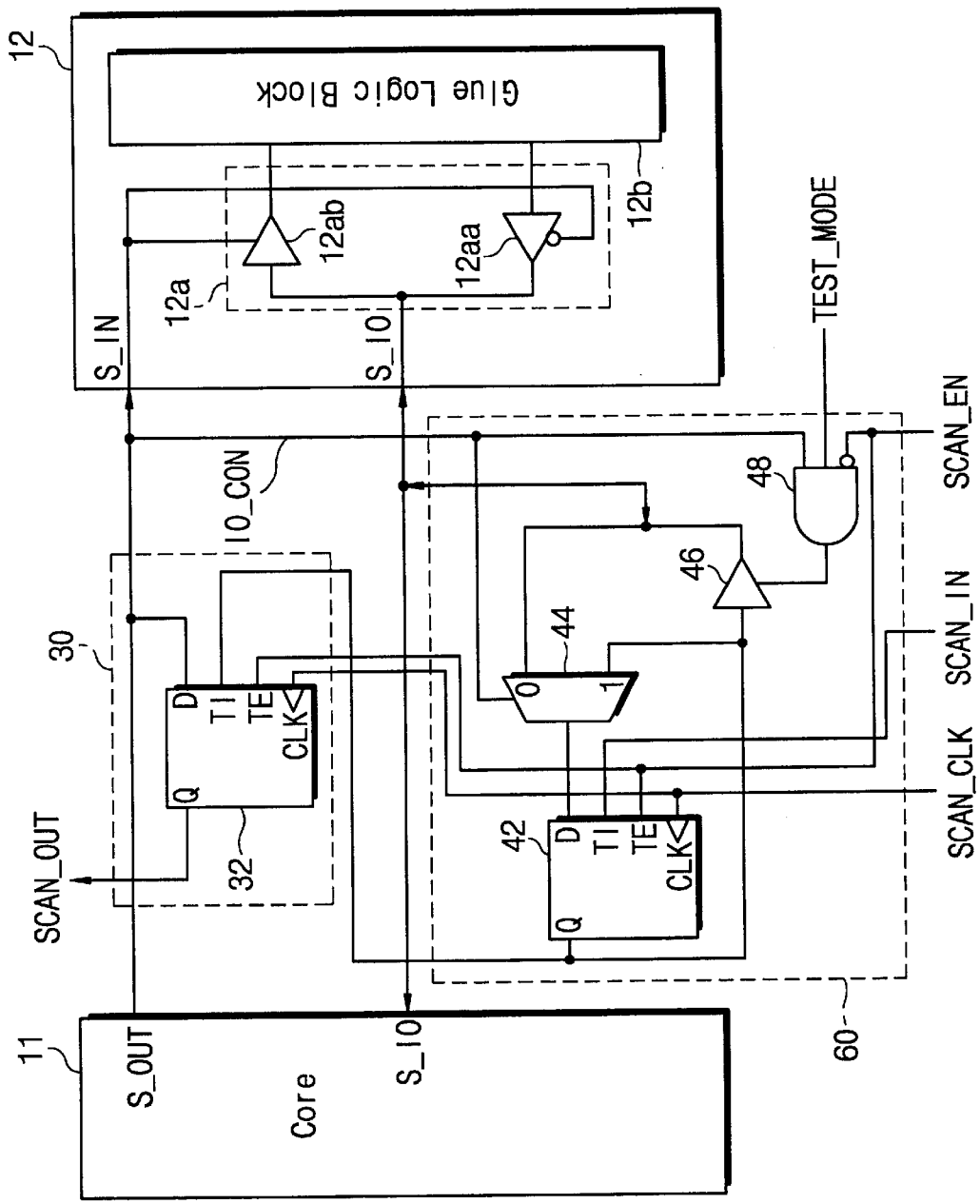
FIG. 6 is a circuit diagram illustrating a boundary scan chain constructed by the scan cells shown in FIGS. 4 and 5.

FIG. 6 is a circuit diagram illustrating a boundary scan chain constructed by the scan cells 30 and 40 shown in FIGS. 4 and 5. Referring to FIG. 6, the scan cell 30 is used for capturing an output signal from the core 11, and the scan cell 40 is used for loading or capturing a bidirectional signal of the glue logic 12.

Depending on the IO control signal IO_CON, the boundary scan cell 40 can capture or drive the bidirectional signal of the glue logic 12 through the bidirectional signal line. To enable the contention-free communication of data between the boundary scan cell 40 and the glue logic 12, the glue logic 12 includes abidirectional buffer 12a for controlling the input/output direction of the glue logic 12. The bidirectional buffer 12a has an input buffer 12ab and an output buffer 12aa. The 10 control signal IO_CON is connected to the bidirectional buffer 12a. When the IO control signal is "0" for input operation of the scan cell 40, the input buffer 12ab is disabled and the output buffer 12aa is enabled. Otherwise, when the IO control signal is "1" for output operation of the scan cell 40, the input buffer 12ab is enabled and the output buffer 12aa is disabled. Thus, the glue logic 12 operates in opposite, or complementary, direction to that of the input/output mode of the boundary scan cell 40.

Although the boundary scan cells 20, 30 and 40 shown above are intended to improve the testability of the glue logic 12, they can also serve the testability of the core 11 by swapping core 11 and glue logic 12 in FIGS. 2, 4 and 5. So, the boundary scan cells 20, 30 and 40 above can be used to improve the testability of either the core 11 or the glue logic 12.

Figure 8:
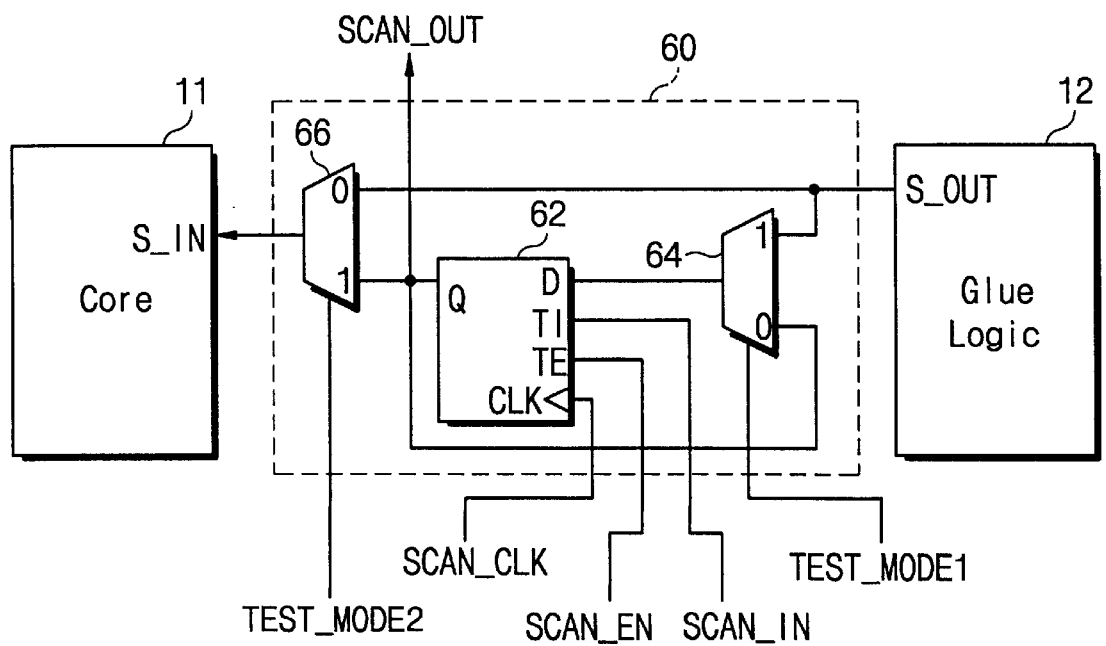
FIG. 8 is a schematic circuit diagram illustrating a boundary scan cell for an output signal of the glue logic and an input signal of the core.
Figure 9:
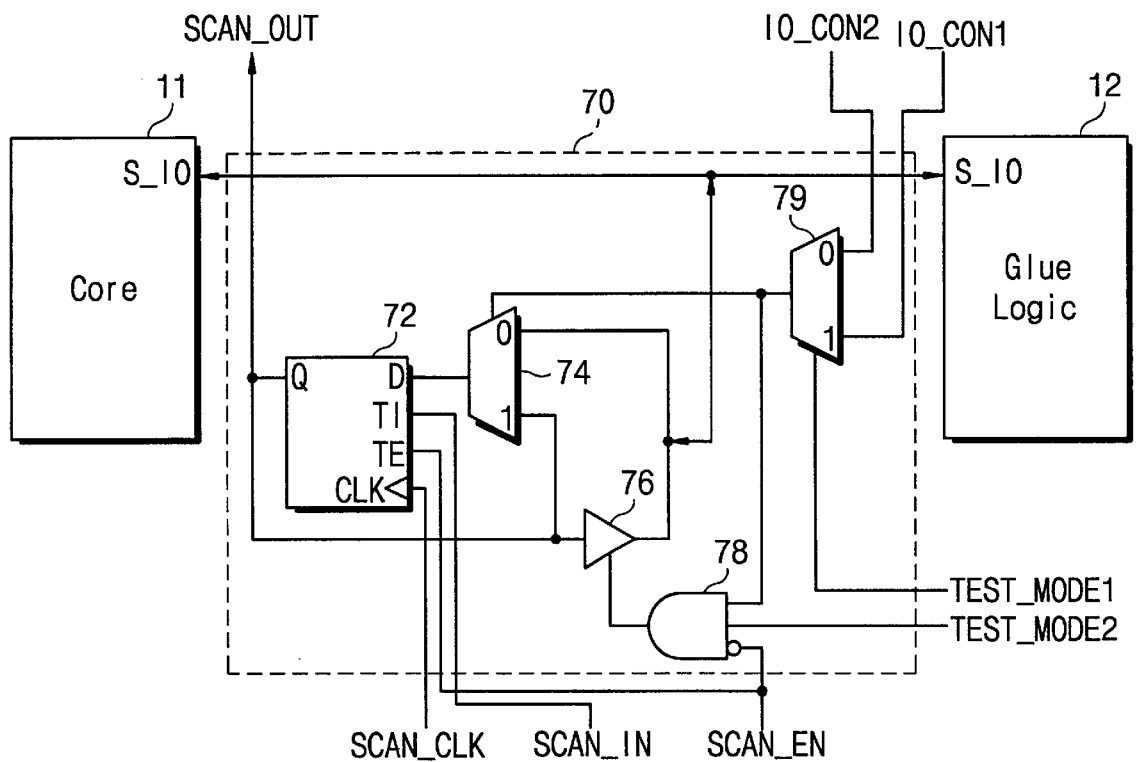
FIG. 9 is a schematic circuit diagram illustrating a boundary scan cell for a bidirectional signal of the core and the glue logic.

To serve both core and logic blocks together, the boundary scan cells need to be configured so that they can be independently used for each block. Such boundary scan cells 50, 60 and 70 are shown in FIGS. 7, 8 and 9, extending the data loading or capturing capabilities of the boundary scan cells 20, 30 and 40 shown in FIGS. 2, 4 and 5, respectively.

Figure 7:
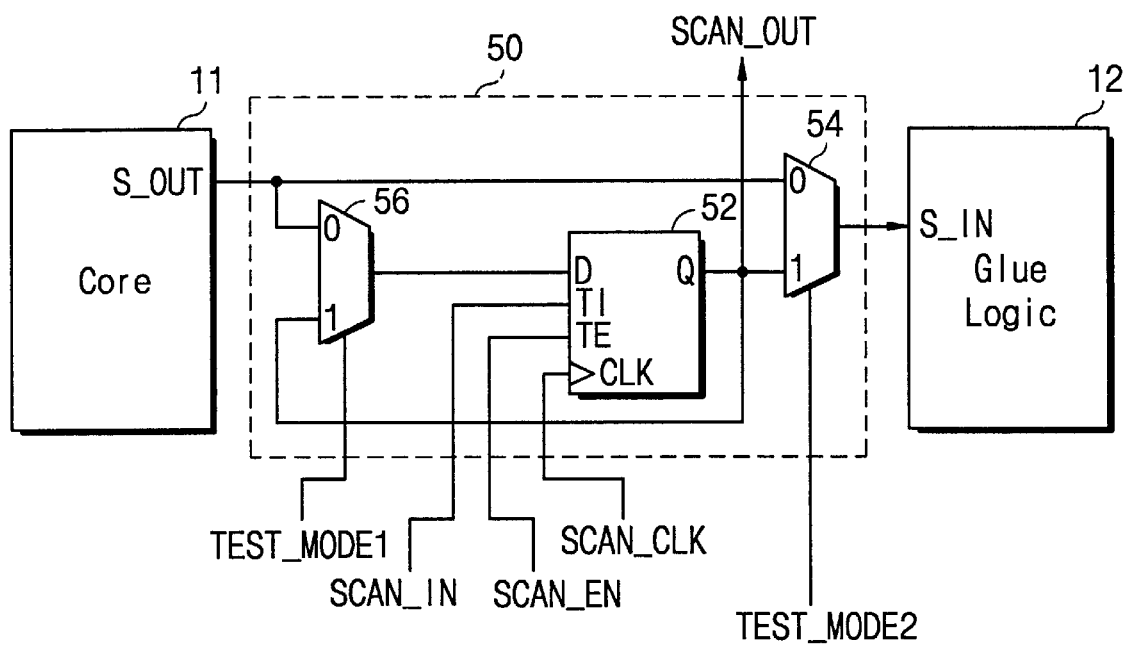
FIG. 7 is a schematic circuit diagram illustrating a boundary scan cell for an output signal of the core and an input signal of the glue logic.

FIG. 7 is a schematic circuit diagram illustrating a boundary scan cell 50 for an output signal of the core 11 and an input signal of the glue logic 12. Referring to FIG. 7, the scan cell 50 includes a scan flip-flop 52 and two multiplexers 54 and 56.

The scan flip-flop 52 has a data input port D for receiving an input signal from the multiplexer 56, an input port TI for receiving the scan input signal SCAN_IN, an input port TE for receiving the scan enable signal SCAN_EN, a clock input port CLK for receiving the scan clock signal SCAN_CLK, and an output port Q.

The output port S_OUT of the core 11 is coupled to each first input port of the multiplexers 54 and 56. The output port Q of the scan flip-flop 52 is coupled with each second input port of the multiplexers 54 and 56. An output port of the multiplexer 56 is coupled to the data input port D of the scan flip-flop 52. The multiplexer 56 outputs either the output signal from the core 11 or the scan output signal SCAN_OUT from the scan flip-flop 52 to the data input port D of the scan flip-flop 52 in response to a first mode control signal TEST_MODE1. The multiplexer 54 outputs either the output signal from the core 11 or the scan output signal SCAN_OUT from the scan flip-flop 52 to an input port S_IN of the glue logic 12 in response to a second mode control signal TEST_MODE2. Test items of the scan cell 50 corresponding to the first and the second mode control signals TEST_MODE1 and TEST_MODE2 are described in Table 2.

TABLE 2

| TEST_MODE2 | TEST_MODE1 | Test Item |
| --- | --- | --- |
| 0 | ' | Functional Operation |
| 1 | 0 | Core Test |
| 1 | 1 | Glue Logic Test |

As shown in Table 2, the second mode control signal TEST_MODE2 classifies operation modes of the scan cell 50 into a functional operation mode and a test mode. The first mode control signal TEST_MODE1 classifies the test mode of the scan cell 50 into a core test mode and a glue logic test mode.

When the second mode control signal TEST_MODE2 is "0" (i.e., functional operation mode), the output signal from the core 11 is input to the glue logic 12 through the multiplexer 54 without effect on the output signal as it passes through the scan cell 50.

When the second mode control signal TEST_MODE2 is "1", the scan cell 50 executes test operation. If the first mode control signal TEST_MODE1 is "0", the scan cell 50 performs a core test operation. For example, if the scan enable signal SCAN_EN is "0", the scan cell 50 captures the output signal of the core 11, and if the scan enable signal SCAN_EN becomes "1", the captured signal is outputted to a scan chain (not shown) by scan operation of the scan flip-flop 52. And if the first mode control signal TEST_MODE1 is "1", the scan cell 50 performs a glue logic test operation. For example, if the scan enable signal SCAN_EN is "1", the scan cell 50 generates a scan output signal SCAN_OUT to the scan chain (not shown). The scan output signal SCAN_OUT is held by a feedback path between the output port Q and the data input port D. In that case, if the scan enable signal SCAN_EN becomes "0", the held scan output signal SCAN_OUT is loaded to the glue logic 12 through the multiplexer 54.

As described above, the scan cell 50 can be used for input signal loading to the glue logic 12 or for output signal capturing from the core 11, when the mode control signals TEST_MODE1 and TEST_MODE2 are set accordingly.

FIG. 8 is a schematic circuit diagram illustrating a boundary scan cell 60 for an output signal of the glue logic 12 and an input signal of the core 11. Referring to FIGS. 7 and 8, the scan cells 50 and 60 are symmetric (mirrored left-to-right) except that the data input signals of the multiplexers 56 and 64 are reversed (both being controlled by TEST_MODE1). This is to use the test mode settings shown in Table 2 when both boundary scan cells 50 and 60 are to be implemented in a circuit.

FIG. 9 is a schematic circuit diagram illustrating a boundary scan cell 70 for a bidirectional signal of the core 11 and the glue logic 12. Referring to FIG. 9, the boundary scan cell 70 is basically the same as the scan cell 40 shown in FIG. 5 except that there are separate IO control signals IO_CON1 and IO_CON2 to provide the 10 control signals that determine the direction of boundary scan cell 70 independently in the different test modes. Following the test mode settings shown in Table 2; the core 11 and the glue logic can be tested independently. Hence, either the core 11 or the glue logic 12 can communicate with the boundary scan cell 70 during a test mode and the other one of core 11 and glue logic 12 should be disabled in order to avoid any bus contention problems.

Figure 10:
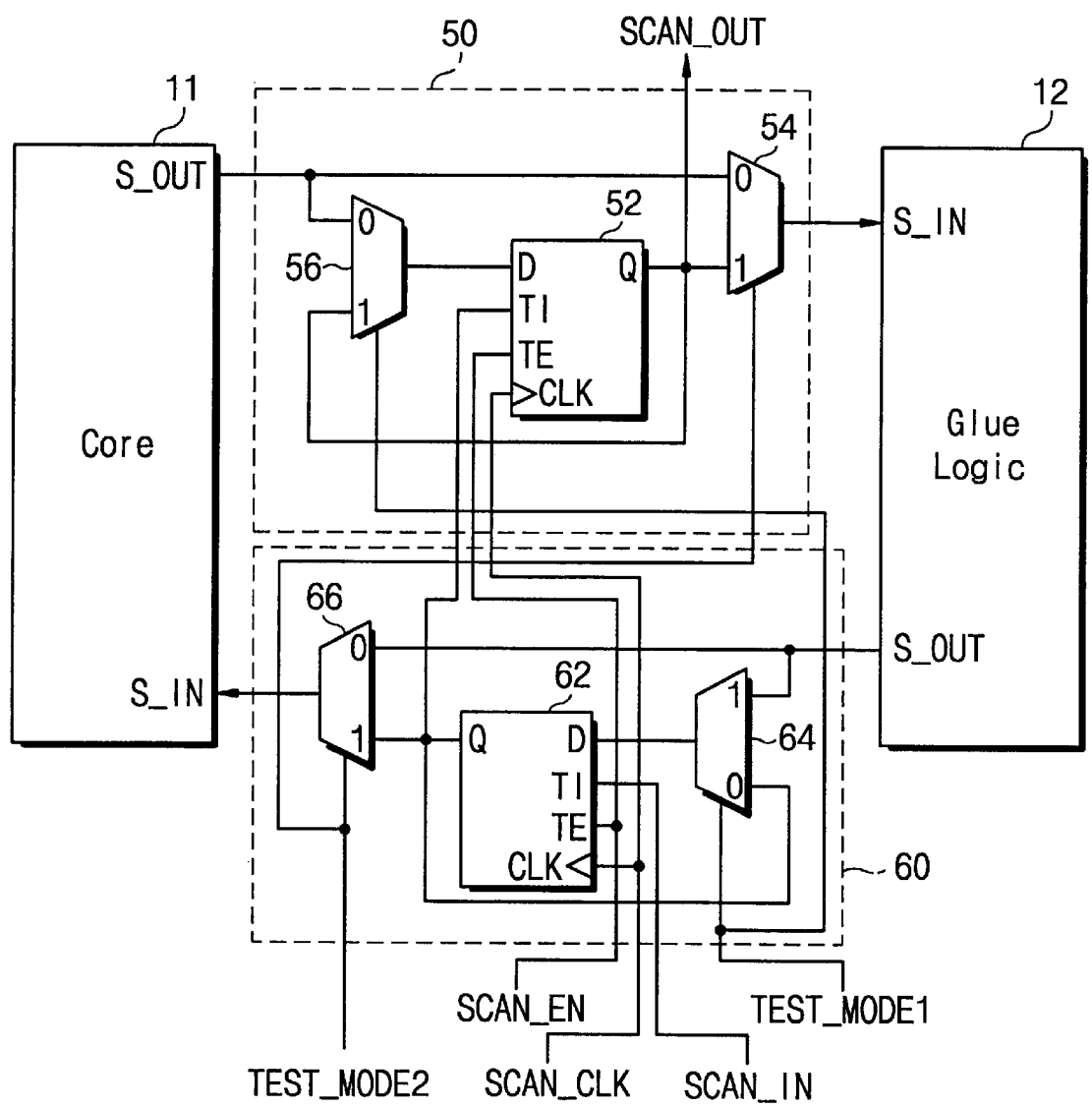
FIG. 10 is a circuit diagram illustrating a boundary scan chain constructed by the scan cells shown in FIGS. 7 and 8.

FIG. 10 is a circuit diagram illustrating a boundary scan chain constructed by the scan cells 50 and 60 shown in FIGS. 7 and 8; The boundary scan cell 50 is used for an output signal of the core 11 and an input signal of the glue logic 12, and the boundary scan cell 60 is used for an output signal of the glue logic 12 and an input signal of the core 11.

The scan cell 50 can load the input signal to the glue logic 12 and capture the output signal from the core 11, and the scan cell 60 can capture the output signal from the glue logic 12 and load the input signal to the core 11, when the mode control signals TEST_MODE1 and TEST_MODE2 are set accordingly.

Therefore, the testability of the core 11 and the glue logic 12 coupled to a uni-directional signal line can be improved by the scan cells 50 and 60.

Figure 11:
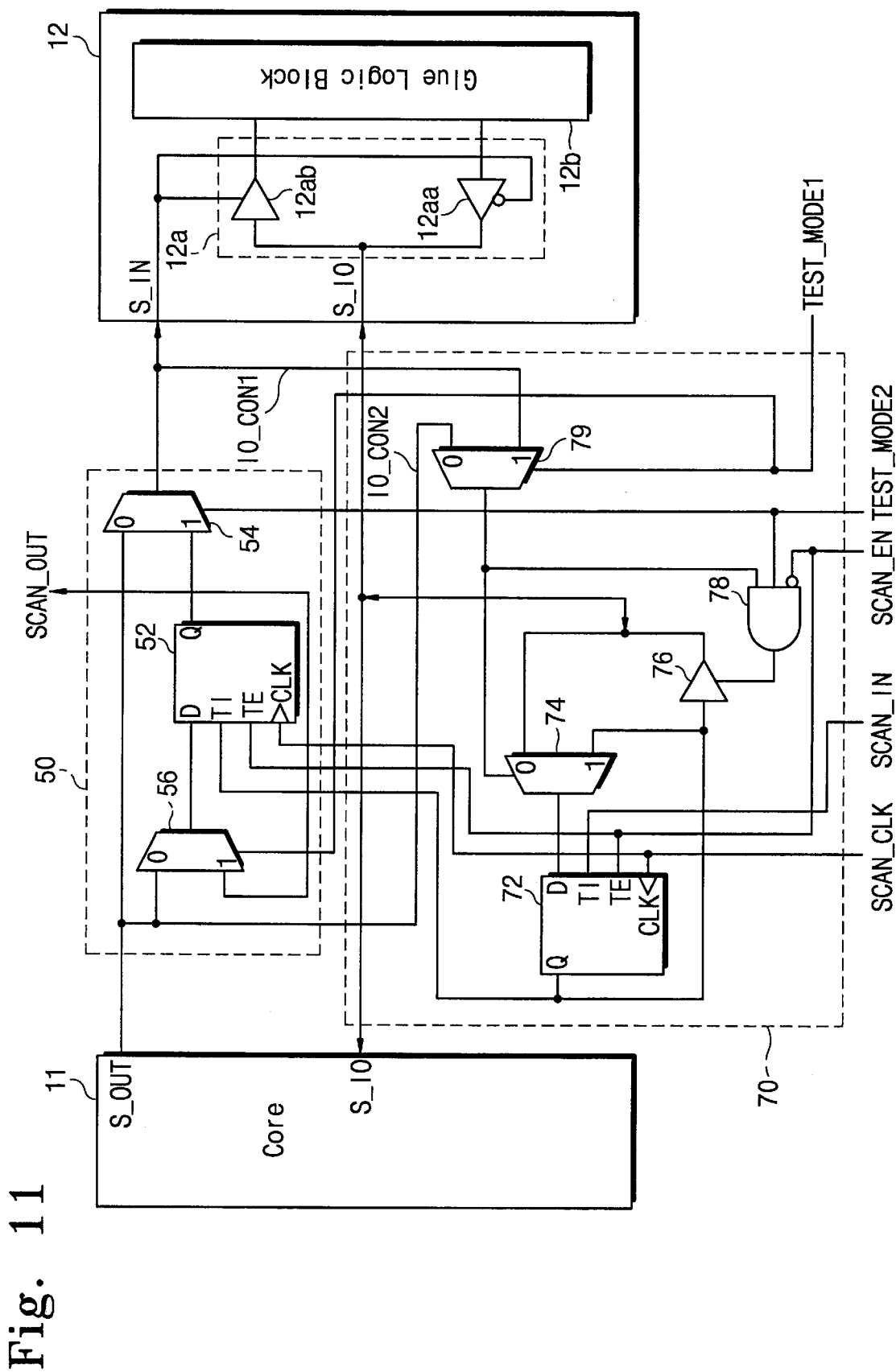
FIG. 11 is a circuit diagram illustrating a boundary scan chain constructed by the scan cells shown in FIGS. 7 and 9.

FIG. 11 is a circuit diagram illustrating a boundary scan chain constructed by the scan cells 50 and 70 shown in FIGS. 7 and 9. The boundary scan cell 50 is used for an output signal of the core 11 and an input signal of the glue logic 12, and the boundary scan cell 70 for a bidirectional signal of the core 11 and the glue logic 12.

Depending on the second IO control signal IO_CON2, the boundary scan cell 70 can capture or drive the bidirectional signal of the glue logic 12 through the bidirectional signal line. To enable the contention-free communication of data between the boundary scan cell 70 and the glue logic 12, the glue logic 12 includes a bidirectional buffer 12a for control input/output mode of the glue logic 12. The bidirectional buffer 12a has an input buffer 12ab and an output buffer 12aa. The second IO control signal IO_CON2 is connected to the bidirectional buffer 12a. Similarly, depending on the first IO control signal IO_CON1, the boundary scan cell 70 can capture or drive the bidirectional signal of the core 11 through the bidirectional signal line and the boundary scan cell 50 can capture the output signal from the core 11 through the uni-directional signal line. To enable the contention-free communication of data between the boundary scan cells 50 and 70 and the core 11, the core 11 also includes a bidirectional buffer (not shown) for control input/output mode of the core 11. This bidirectional buffer will be understood to be similar to bidirectional buffer 12a of glue logic 12.

For example, when the IO control signal IO_CON2 is "0" for input operation of the scan cell 70, the input buffer 12ab is disabled and the output buffer 12aa is enabled. Otherwise, when the IO control signal IO_CON2 is "1" for output operation of the scan cell 70, the input buffer 12ab is enabled and the output buffer 12aa is disabled. Thus, the glue logic 12 operates in opposite, or complementary, direction to input/output mode of the boundary scan cell 70. Thus, the boundary scan cells 50 and 70 above can be used to improve the testability of the core 11 and the glue logic 12, together.

As described above, the boundary scan cells according to the present invention are able to capture and/or drive test data for the glue logic test and/or for the core test. For the bidirectional signals, the proposed boundary scan cell structure obviates any unnecessary delay addition on the data path due to the implementation of the boundary scan cells. Contrasted with the JTAG method, the boundary scan cells according to the present invention have several characteristics that a pin overhead is minimal, a circuit area overhead is minimal, the boundary scan cells have low gate counts, and the test mode control is simple.

While the invention has been described in terms of an exemplary embodiment, it is contemplated that it may be practiced as outlined above with modifications within the spirit and scope of the appended claims.

What is claimed is:

1. A core-embedded integrated circuit, comprising:
   a first logic block;
   a second logic block;
   a bidirectional signal line coupled between the first logic block and the second logic block, for inputting/outputting a bidirectional input/output signal of the logic blocks; and
   a boundary scan cell coupled to the bidirectional signal line, for loading/capturing the bidirectional input/output signal for testing one or both of the first logic block and the second logic block, the boundary scan cell include a data holding capability for data loading,
   wherein the testability of the first logic block the second logic block can be interchanged, and
   wherein the boundary scan cell is adapted for serial connection with each of a plurality of like boundary scan cells in a single chain.

2. A core-embedded integrated circuit, comprising:
   a core;
   a glue logic surrounding the core;
   a bidirectional signal line coupled between the core and the glue logic , for inputting/outputting a bidirectional input/output signal of the core and glue logic;
   a unidirectional signal line coupled between the core and the glue logic for outputting a unidirectional signal of the core to the glue logic; and
   a first boundary scan cell coupled to the bidirectional signal line, for loading/capturing the bidirectional input/output signal for testing one or more of the core and the glue logic, the boundary scan cell including a data holding capability for data loading
   a second boundary scan cell coupled to the unidirectional signal line, for loading/capturing the unidirectional output signal of the core for testing one or more of the core and the glue logic,
   wherein the boundary scan cells are adapted for serial connection with each of a plurality of boundary scan cells in a single chain.

3. The core-embedded integrated circuit of claim 2, wherein the first boundary scan cell comprises:
   a scan flip-flop having a plurality of input ports receiving a data input signal, a scan input signal, a scan enable signal and a scan clock signal, and an output port, so as to perform a scan operation for generating a scan output signal, and a normal operation for capturing the bidirectional signal or loading the scan output signal into one of the core or glue logic through the bidirectional signal line;
   a first multiplexer for generating the data input signal of the first scan flip-flop by selecting either the bidirectional signal from the bidirectional signal line or the scan output signal from the scan flip-flop, to perform a normal operation of the core and glue logic, in response to an input/output control signal determining an input/output direction of the scan cell;
   a logic circuit for generating a load control signal in response to the scan enable signal enabling the scan operation, the first mode control signal enabling a test operation of the core and glue logic, and the input/output control signal determining the direction of the scan cell;
   a tri-state buffer for loading the scan output signal to one of the core or glue logic through the bidirectional signal line in response to the load control signal.

4. The core-embedded integrated circuit of claim 3, wherein the scan flip-flop further comprises:
   a second multiplexer for selecting either the data input signal or the scan input signal in response to the scan enable signal; and
   a D-type flip-flop for generating the scan output signal in response to an output of the second multiplexer and the scan clock signal.

5. The core-embedded integrated circuit of claim 3, wherein the tri-state buffer becomes high impedance state during the scan operation of the scan cell, so as to prevent a bus conflict among the plurality of boundary scan cells.

6. The core-embedded integrated circuit of claim 3, wherein the tri-state buffer assumes a high impedance state during the normal operation of the core and glue logic, so that the core and glue logic communicate via the bidirectional signal line without effect while passing through the scan cell.

7. The core-embedded integrated circuit of claim 3, wherein the scan flip-flop further comprises a third multiplexer for generating the input/output control signal by selecting either a first input/output control signal for determining an input/output direction of the core, or the second input/output control signal for determining an input/output direction of the glue logic, in response to a second mode control signal, so as to test both the core and glue logic.

8. The core-embedded integrated circuit of claim 2, wherein the scan output signal is held by a feedback loop between the output port and the input port during the normal operation.

9. The core-embedded integrated circuit of claim 2, wherein the testability of the core and the glue logic are interchangeable.

10. The core-embedded integrated circuit of claim 9, wherein the second logic is a core or a glue logic, and wherein the glue logic is a user defined logic surrounding the core.

11. The core-embedded integrated circuit of claim 2, wherein the second boundary scan cell comprises a scan flip-flop having a plurality of input ports receiving a data input signal, a scan input signal, a scan enable signal and a scan clock signal, and an output port, so as to perform a scan operation for generating a scan output signal, and a normal operation for capturing the unidirectional signal or loading the scan output signal into the glue logic through the unidirectional signal line.

12. The core-embedded integrated circuit of claim 2, wherein the first boundary scan cell comprises:
   a scan flip-flop having a plurality of input ports receiving a data input signal, a scan input signal, a scan enable signal and a scan clock signal, and an output port, the scan cell flip-flop performing a scan operation for generating a scan output signal, the scan flip-flop also performing a normal operation for capturing the bidirectional signal or loading the scan output signal into one of the core or glue logic through the bidirectional signal line;

a first multiplexer for generating the data input signal of the scan flip-flop by selecting either the bidirectional signal from the bidirectional signal line or the scan output signal from the scan flip-flop, to perform a normal operation of the core and glue logic, in response to an input/output control signal determining an input/output direction of the scan cell;

a second multiplexer controlled by a test mode control signal selecting one of the input/output of the core or the input/output of the glue logic for data holding purposes;

a logic circuit for generating a load control signal in response to the scan enable signal enabling the scan operation, the first mode control signal enabling a test operation of the core and glue logic, and the input/output control signal determining the direction of the scan cell;

a tri-state buffer for loading the scan output signal to one of the core or glue logic through the bidirectional signal line in response to the load control signal.

13. The core-embedded integrated circuit of claim 2, wherein the second boundary scan cell comprises:

a scan flip-flop having a plurality of input ports receiving a data input signal, a scan input signal, a scan enable signal and a scan clock signal, and an output port, so as to perform a scan operation for generating a scan output signal, and a normal operation for capturing the unidirectional signal from the core or loading the scan output signal into the glue logic through the unidirectional signal line;

a first multiplexer for generating the data input signal of the scan flip-flop by selecting either the unidirectional signal from the unidirectional signal line or the scan output signal from the scan flip-flop; and a second multiplexer controlled by a test mode control signal selecting one of the output of the core or the input of the glue logic for data holding purposes.

14. A core-embedded integrated circuit, comprising:

a first logic block;

a second logic block;

a first uni-directional signal line for inputting an output signal from the first logic block to the second logic block as an input signal;

a second uni-directional signal line for inputting an output signal from the second logic block to the first logic block as an input signal; and a first boundary scan cell interposed between the first logic block and the second logic block, for capturing the output signal from the first logic block and loading the input signal to the second logic block, so as to test at least one of the first and the second logic blocks, wherein each scan cell has a data holding capability for data loading, a second boundary scan cell interposed between the first logic block and the second logic block, for capturing the output signal from the second logic block and loading the input signal to the first logic block, so as to test at least one of the first and the second logic blocks, wherein each scan cell has a data holding capability for data loading;

wherein the boundary scan cells are adapted for serial connection with each of a plurality of like boundary scan cells in a single chain.

15. The core-embedded integrated circuit of claim 14, wherein the boundary scan cells comprise:

a first scan flip-flop having a plurality of input ports receiving a data input signal, a scan input signal, a scan enable signal and a scan clock signal, and an output port, so as to perform a scan operation for generating a first scan output signal, and a normal operation for capturing the output signal from the first logic block and loading the scan output signal to the second logic block as the input signal through the uni-directional signal line;

a second scan flip-flop having a plurality of input ports receiving a data input signal, a scan input signal, a scan enable signal and a scan clock signal, and an output port, so as to perform a scan operation for generating a second scan output signal, and a normal operation for capturing the output signal from the second logic block and loading the scan output signal to the first logic block as the input signal through the uni-directional signal line;

a first multiplexer for generating the data input signal by selecting either the output signal from the first logic to test the first logic block or the scan output signal from the first scan flip-flop in response to a first mode control signal to test the second logic block; and a second multiplexer for generating the input signal of the second logic block by selecting either the output signal from the first logic to a non-test operation of the scan cell, or the second scan output signal in response to a second mode control signal to test the scan cell.

16. The core-embedded integrated circuit of claim 15, wherein each scan flip-flop comprises:

a third multiplexer for selecting either the input data or the scan input signal in response to the scan enable signal; and a D-type flip-flop for generating the scan out signal in response to an output of the third multiplexer and the scan clock signal.

17. The core-embedded integrated circuit of claim 15, wherein each scan output signal is held by a feedback loop between the output port and the input port during the non-test operation.

18. The core-embedded integrated circuit of claim 15, wherein the output signal from the first logic block is inputted to the second logic block through the second multiplexer without passing through the scan cell during the non-test operation.

19. he core-embedded integrated circuit of claim 15, wherein the output signal from the second logic block is inputted to the first logic block through the second multiplexer without passing through the scan cell during the non-test operation.

20. The core-embedded integrated circuit of claim 14, wherein the first logic block is a core.

21. The core-embedded integrated circuit of claim 20, wherein the second logic block is a glue logic surrounding the core.

* * * * *

UNITED STATES PATENT AND TRADEMARK OFFICE
CERTIFICATE OF CORRECTION

PATENT NO. : 6,374,380 B1
DATED : April 16, 2002
INVENTOR(S) : Gyoo-Chan Sim

It is certified that error appears in the above-identified patent and that said Letters Patent is hereby corrected as shown below:

Column 6,
Line 34, "abidirectional" should be -- a bidirectional --.

Column 8,
Line 7, "the 10 control" should be -- the IO control --.
Line 10, "Table 2;" should be -- Table 2, --.

Signed and Sealed this

Nineteenth Day of November, 2002

Attest:

Attesting Officer

JAMES E. ROGAN
*Director of the United States Patent and Trademark Office*